US006980141B2

(12) United States Patent
Trocque

(10) Patent No.: US 6,980,141 B2
(45) Date of Patent: Dec. 27, 2005

(54) ANALOG INPUT FOR ELECTRONIC CIRCUIT

(75) Inventor: François Trocque, Escoville (FR)

(73) Assignee: Crouzet Automatismes, Valence (FR)

( * ) Notice: Subject to any disclaimer, the term of this patent is extended or adjusted under 35 U.S.C. 154(b) by 1 day.

(21) Appl. No.: 10/486,712

(22) PCT Filed: Aug. 30, 2002

(86) PCT No.: PCT/FR02/02981

§ 371 (c)(1),
(2), (4) Date: Feb. 13, 2004

(87) PCT Pub. No.: WO03/021789

PCT Pub. Date: Mar. 13, 2003

(65) Prior Publication Data

US 2004/0246157 A1 Dec. 9, 2004

(30) Foreign Application Priority Data

Sep. 5, 2001 (FR) .............................. 01 11487

(51) Int. Cl.⁷ ................................................ H03M 1/10
(52) U.S. Cl. ...................................... 341/120; 341/155
(58) Field of Search ............................... 341/118, 120, 341/155; 324/607, 612

(56) References Cited

U.S. PATENT DOCUMENTS

| | | | | |
|---|---|---|---|---|
| 3,653,037 A | * | 3/1972 | Utley | 341/120 |
| 5,077,555 A | * | 12/1991 | Weber | 341/155 |
| 5,172,115 A | | 12/1992 | Kerth et al. | |
| 5,179,379 A | * | 1/1993 | Allen et al. | 341/118 |
| 6,396,426 B1 | * | 5/2002 | Balard et al. | 341/120 |
| 6,580,277 B1 | * | 6/2003 | Bolz | 324/608 |
| 6,657,423 B2 | * | 12/2003 | Tanizawa | 324/72 |
| 6,745,120 B2 | * | 6/2004 | Iwagami et al. | 701/114 |

OTHER PUBLICATIONS

Kollataj; "Digitized Thermocouple Compensation Yields Direct Reading For Data Logger"; Electronics, Feb. 2, 1970, USA, vol. 43, No. 3, pp. 116–119; XP002211369.

Gardner et al; "High–precision intelligent interface for a hybrid electronic nose"; Sensors and Actuators A, Elsevier Sequoia S.A., Lausanne, CH, vol. 62, No. 1–3; Jul. 1, 1997, pp. 724–728; XP004119715.

Padda et al; "Serial A/D makes system design eady and cost effective"; Electro 84. Electronic Show and Convention, Boston, MA, USA, May 15–17, 1984, pp. 22/2/1–7; XP002211370.

* cited by examiner

Primary Examiner—Peguy JeanPierre
(74) Attorney, Agent, or Firm—Lowe Hauptman & Berner, LLP

(57) ABSTRACT

The invention relates to an analog input for electronic circuit, which input is intended to be connected to an electrical output of a sensor for measuring a physical parameter, the sensor being supplied with a supply voltage Vcc and providing at its electrical output an analog voltage Vs dependent on the parameter to be measured, the analog input comprising an analog/digital converter of resolution $R_N$, wherein it comprises a computer controlling the analog/digital converter so as to perform an analog/digital conversion of the supply voltage Vcc, the analog/digital converter providing the computer with a digital value Rsupp of the supply voltage Vcc of the sensor, an analog/digital conversion of the analog voltage Vs of the parameter to be measured, the analog/digital converter providing the computer with a digital value r of the analog voltage Vs to be measured, and the computer providing a digital value Vn of the parameter to be measured such that: $Vn=(r/Rsupp)R_N$.

20 Claims, 3 Drawing Sheets

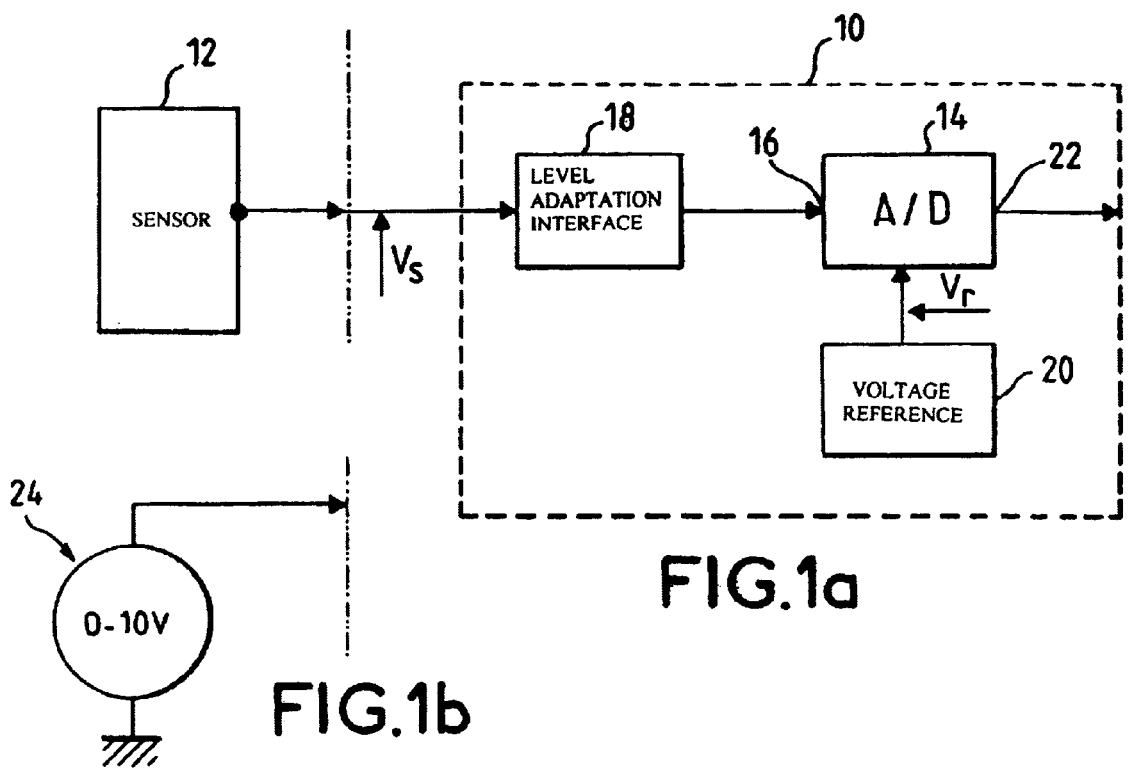
FIG.1a
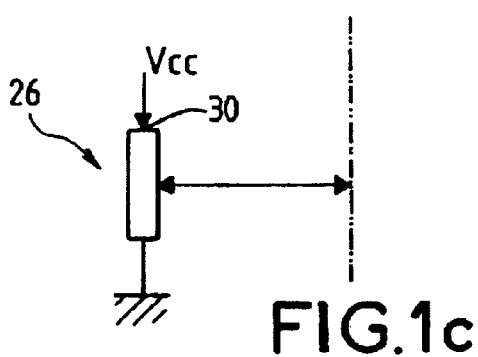
FIG.1b
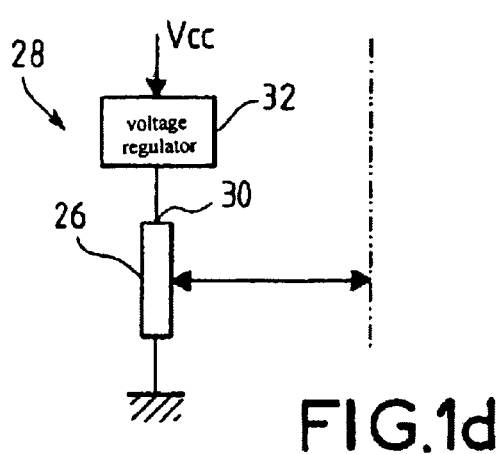
FIG.1c
FIG.1d

ANALOG INPUT FOR ELECTRONIC CIRCUIT

CROSS-REFERENCE TO RELATED APPLICATIONS

The present Application is based on International Application No. PCT/FR02/02981, filed on Aug. 30, 2002, which in turn corresponds to FR 01/11487 filed on Sept. 5, 2001, and priority is hereby claimed under 35 USC §119 based on these applications. Each of these applications are hereby incorporated by reference in their entirety into the present application.

FIELD OF THE INVENTION

The invention relates to an analog input adaptable to the electrical output level of a sensor responsive to a physical parameter.

BACKGROUND OF THE INVENTION

Electrical or electronic automatic control units generally comprise one or more inputs for signals, in particular for analog signals provided by sensors of physical parameters such as pressure, temperature, linear displacement or any other type of parameter. The automatic control unit is made so as to carry out functionalities preprogrammed on the basis of the level or of the state of these parameters.

FIG. 1a shows the schematic of a prior art analog input 10 connected to the output of a sensor 12 providing the analog input with a voltage Vs dependent on a physical parameter used by the automatic control unit.

The analog input 10 essentially comprises an analog/digital converter 14 fed, via its analog input 16 through a level adaptation interface 18, with the voltage Vs output by the sensor and a voltage reference Vr 20 for the analog/digital converter 14.

The analog/digital converter 14 provides a digital cue, at its digital output 22, dependent on the level of the input voltage Vs applied to its analog input 16. This digital cue is used by an electronic processing circuit, for example an automatic control unit.

The voltage reference 20 is necessary to obtain the precision of conversion into digital of the analog voltage applied to the input 16 of the analog/digital converter 14.

The theoretical dynamic range of the analog input level Vs is a fixed value corresponding to the normalized standard dynamic range of the sensors, for example from 0 to 10 volts.

FIGS. 1b, 1c and 1d show respectively three types of sensors 24, 26 and 28 that can be connected to the analog input of FIG. 1a.

SUMMARY OF THE INVENTION

The sensor connected to the analog input can be:

either a 0–10 volts sensor 24 (see FIG. 1b) providing a voltage lying between 0 and 10 volts corresponding to the analog voltage range accepted by the analog input so as to benefit from the maximum resolution of the analog/digital converter. The drawback of such a 0–10 volt sensor is that it requires a supply voltage regulated in such a way that it provides a maximum output voltage always equal to 10 volts.

or a potentiometer 26 (see FIG. 1c) used for measurements of linear or angular position. The potentiometer 26 provides a voltage varying between 0 volts and the voltage of the live point 30 of the potentiometer as a function of the position of the slider. The live point 30 of the potentiometer is usually at the potential of the supply voltage Vcc of the electrical system comprising among other things the automatic control unit. This supply voltage Vcc is rather unstable and sometimes unregulated, each electronic element of the system comprising its own regulating device.

The drawback of the use of the potentiometer 26 of FIG. 1c supplied with the unregulated voltage Vcc is that, if the supply voltage Vcc becomes less than the maximum voltage accepted by the analog/digital converter, one does not benefit from the resolution of the converter, when the slider is at the level of the live point 30 of the potentiometer. On the other hand, if the supply voltage Vcc overshoots the maximum voltage accepted by the analog/digital converter, the mechanical displacement of the slider is thereby limited to this maximum voltage of the converter, thus correspondingly limiting the range of measurement of the parameter in this instance the maximum possible displacement of the slider up to the live point of the potentiometer. Furthermore, the output voltage of the potentiometer, for any given position of the slider, will vary as a function of the voltage Vcc applied to its live point, thus impairing the reliability of a position measurement. To avoid this drawback, in the prior art, the regulated sensor 28 of FIG. 1d is used. The regulated sensor 28 comprises the potentiometer 26 of FIG. 1c whose live point 30 is supplied with the supply voltage Vcc through a voltage regulator 32 in order to maintain the live point of the potentiometer substantially equal to 10 volts, this comprising the drawback of increasing the cost of the sensor and hence that of the automatic control unit.

To alleviate the drawbacks of the analog inputs of the prior art, the invention proposes an analog input for electronic circuit, which input is intended to be connected to an electrical output of a sensor for measuring a physical parameter, the sensor being supplied with a supply voltage Vcc and providing at its electrical output an analog voltage Vs dependent on the parameter to be measured, the analog input comprising at least one analog/digital converter of resolution RN, characterized in that it comprises a computer controlling the analog/digital converter so as to perform an analog/digital conversion of the supply voltage Vcc, the analog/digital converter providing the computer with a digital value Rsupp of the supply voltage Vcc of the sensor, an analog/digital conversion of the analog voltage Vs of the parameter to be measured, the analog/digital converter providing the computer with a digital value r of the analog voltage Vs to be measured, and the computer providing a digital value Vn of the parameter to be measured such that:

$$Vn = (r/R\text{supp})R_N.$$

One of the principal objects of the invention is that the analog input be reliable and ensure an equal precision of measurement whatever the supply voltage of the sensor or whatever the type of sensor.

Other objects of this invention are:

to benefit from the resolution of the analog/digital converter, to handle overshoots of the nominal range of measurement of the analog input.

Another object of economic type of the invention is to reduce the cost of the analog input by simplifying its manufacture.

In a variant of the invention, the analog input comprises at least two analog/digital converters, a first converter for digitizing the supply voltage Vcc and a second converter for digitizing the analog voltage Vs at the output of the sensor.

In another variant of the invention, the analog input comprises a single analog/digital converter and a multiplexer of the signals emanating from various sensors, each of the signals being digitized sequentially by the analog/digital converter, the multiplexer being controlled by the computer.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

The invention will be better understood with the aid of an exemplary embodiment of the analog input according to the invention with reference to the appended drawings in which:

FIG. 1a represents a schematic of an analog input of the state of the art;

FIGS. 1b, 1c and 1d respectively show three types of sensors customarily connected to the analog input of FIG. 1a;

DETAILED DESCRIPTION OF THE INVENTION

Figure 2:
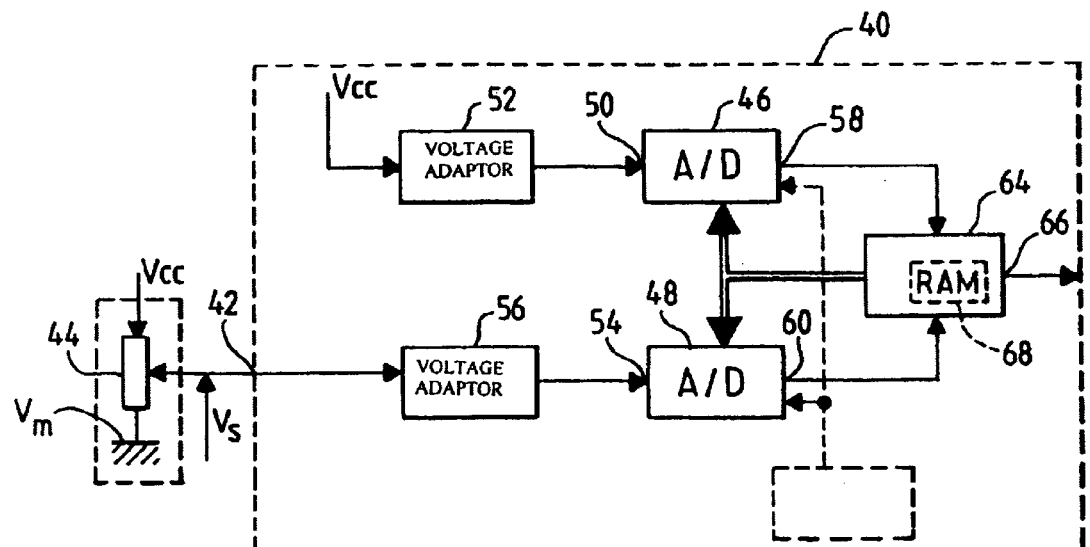
FIG. 2 represents a schematic of an analog input according to the invention comprising two analog/digital converters.

FIG. 2 represents the schematic of an analog input 40, according to the invention, supplied with a supply voltage Vcc and receiving via an input terminal 42 the analog voltage Vs output by a sensor. In the embodiment of FIG. 2 the sensor is a potentiometer 44 connected via its live point to the supply voltage Vcc and via its neutral point to a reference potential Vm, for example the ground of the analog input.

The analog input 40 comprises a first 46 and a second 48 analog/digital converters, the first converter 46 receiving via its analog input 50 through a first voltage adapter 52, the supply voltage Vcc, the second converter 48 receiving via its analog input 54 through a second voltage adapter 56, the analog voltage Vs to be measured taken at the level of the slider of the potentiometer 44.

The first analog/digital converter 46 provides at its digital output 58, the digital value of the supply voltage Vcc, the second converter 48 providing at its digital output 60 the digital value r of the analog voltage level Vs of the sensor.

The analog input 40 comprises a computer 64 programmed to control the two analog/digital converters, the computer receiving the two digital cues Rsupp and r from the analog/digital converters and providing a digital cue Vn dependent on the position of the slider of the potentiometer 44 and such that:

$$Vn=(r/R\text{supp})R_N.$$

We shall subsequently describe the manner of operation of the analog input 40 according to the invention.

The computer is configured to perform the following sequences:

during a first time period T1, the computer 64 instructs the conversion, by the first converter 46, of the analog supply voltage Vcc of the sensor into a first digital value Rsupp, then the placing of this first digital value in a RAM memory 68 of the computer;

during a second subsequent time period T2, the computer 64 instructs the conversion, by the second converter 48, of the analog voltage Vs of the sensor into a second digital value r, then the placing of this second digital value in the RAM memory;

during a third subsequent period T3, the computer performs the computation of the digital value Vn corresponding to the actual parameter measured by the sensor while taking account of the supply voltage Vcc i.e. in this example the position of the slider of the potentiometer 44, such that:

$$Vn=(r/R\text{supp})*R_N$$

$R_N$ being the digital value, related to the resolution of the analog/digital converter, of the number of possible states at its output.

For example, if 8-bit analog/digital converters are used, the number of possible states measured by the converter will be 256. The precision of measurement of the output voltage for a full-scale voltage of 10 volts will be dependent on the resolution of the converter.

Figure 3:
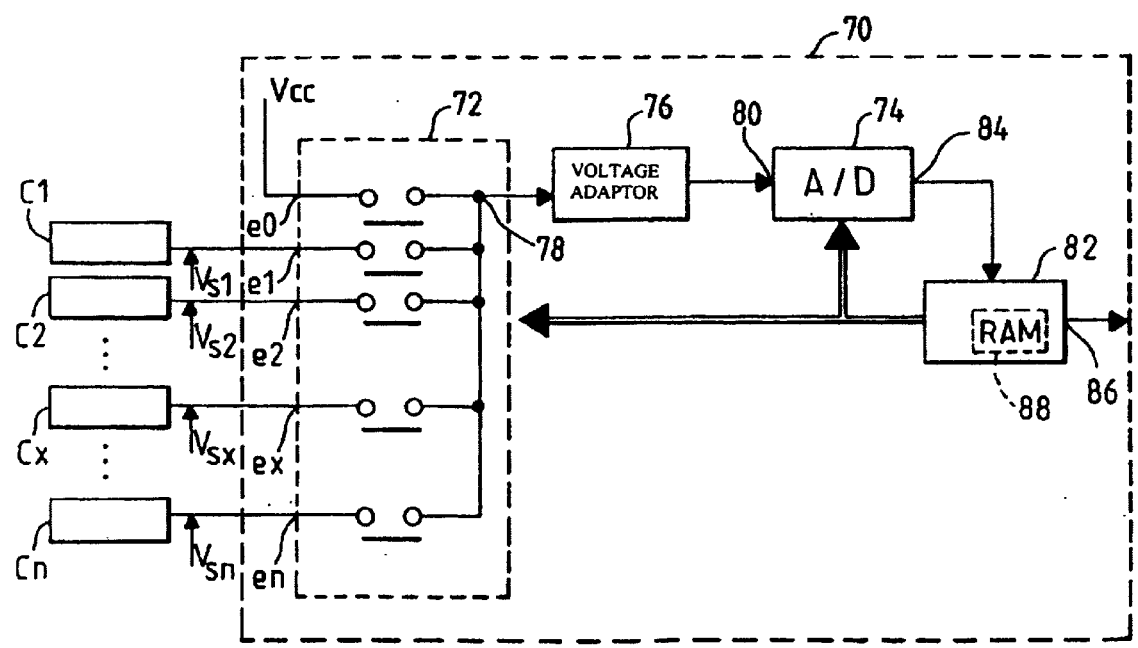
FIG. 3 represents a schematic of an analog input according to the invention comprising a single analog/digital converter and a signal multiplexer.
Figure 4:
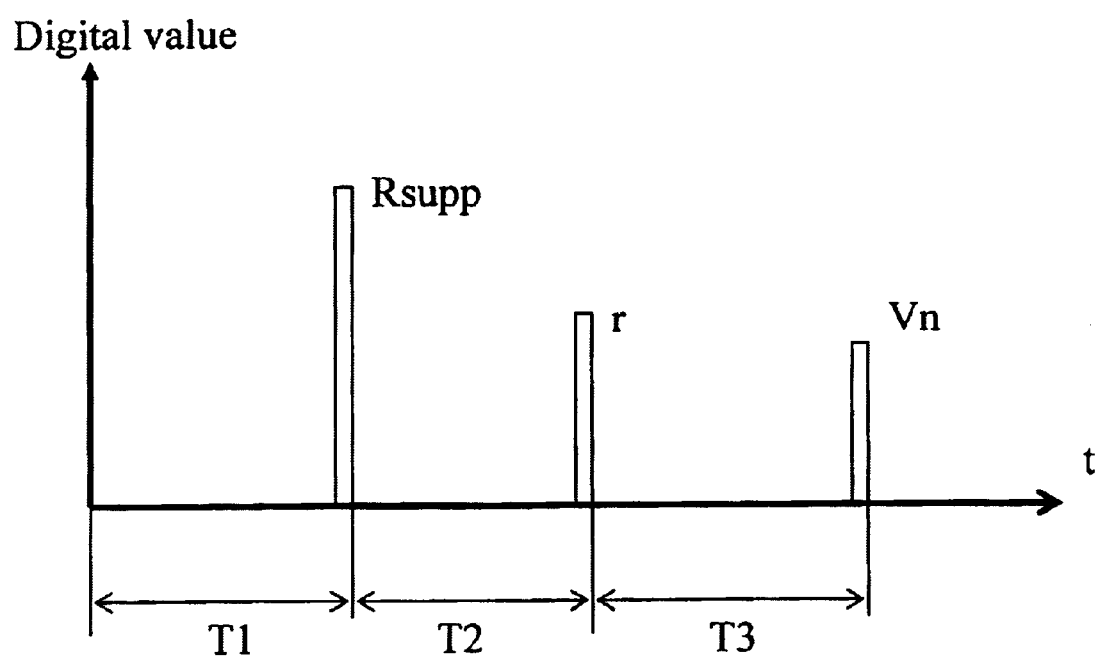
FIG. 4 is a timing diagram illustrating different timing periods of a computer sequence.

FIG. 3 represents a schematic of another analog input 70 according to the invention comprising a signal multiplexer 72 and a single analog/digital converter 74.

The analog/digital converter 74 receives, through a voltage adapter 76, the voltage of one of the selected inputs of the signal multiplexer 72.

The multiplexer 72 comprises n+1 inputs (e0, e1, e2, ..., ex, ..., en) and an output 78 connected through the voltage adapter 76 to the analog input 80 of the analog/digital converter 74. The first input e0 (for example) of the multiplexer is connected to the supply voltage Vcc, each of the other inputs of the multiplexer (e1, e2, ..., ex, ..., en) being connected to a respective sensor C1, C2, ..., Cn respectively providing the voltages Vs1, Vs2, ..., Vsn corresponding to the various physical parameters measured by these sensors.

The advantage of the analog input 70 according to the invention is that the sensors may be of different kinds such as those of FIGS. 1b, 1c, 1d.

The analog input 70 comprises a computer 82 configured to control the analog/digital converter 74 and the signal multiplexer 72. The computer 82 receives the digital cues from the digital output 84 of the analog/digital converter 74 and provides at a digital output 86 a digital cue Vnx (with x=1, 2, ..., n) dependent on the physical parameter measured by the sensor and corrected as a function of the supply voltage Vcc such that $$Vnx=(rx/R\text{supp})R_N.$$

We shall subsequently describe the manner of operation of the analog input 70 according to the invention.

The computer is configured to perform the following sequences:

during a first time period T10: instruction by the computer for selection of the input c0 of the multiplexer and conversion, by the analog/digital converter 74 of the analog supply voltage Vcc of the sensor present at this input c0 of the multiplexer 72 into a first digital value Rsupp, then placement of this first digital value in a RAM memory 86 of the computer;

during subsequent time periods T11, T12, . . . , T1n, instruction by the computer for sequential selection of the inputs e1, e2, . . . , ex, . . . , en of the multiplexer and conversion, by the analog/digital converter 74, of the respective analog voltage Vs1, Vs2, . . . , Vsx, . . . , Vsn at the output of the respective sensor C1, C2, . . . , Cx, . . . , Cn into a respective digital value r1, r2, . . . , rx, . . . , rn and placement of each of these values in memory, then computation of the respective digital value Vn1, Vn2, . . . , Vnx, . . . , Vnn of the value corresponding to the voltages Vs1, Vs2, . . . , Vsx, . . . , Vsn at the output of the respective sensors C1, C2, . . . , Cx, . . . , Cn, in such a way that:

$$Vnx = (rx/Rsupp) * R_N \text{ with } x=1, 2, \ldots n$$

The sequence of the measurements of the voltages Vs1, Vs2, . . . , Vsx, . . . , Vsn and therefore of the sequence of the selections of the inputs of the multiplexer can be subject to priorities preprogrammed into the computer.

In the particular case where the analog input is connected to a 0–10 volts sensor such as that of FIG. 1b, the measurement of the voltage Vcc is unnecessary, in this case the computer will provide a digital value of the analog voltage at the output of the sensor, such that:

$Vsx = (rx/R_{10}) R_N$ $R_{10}$ being the digital value corresponding to the maximum output voltage of the sensor, i.e. 10 volts.

In the embodiment of the analog input of FIG. 3 comprising multiple inputs, the computer 64 is configured to take account of the type of sensor used for each input and to do the appropriate computation.

In the analog input of FIG. 3, the computation sequence may be different, thus, it is possible to perform the measurement of the supply voltage Vcc, the measurement of one of the selected inputs of the multiplexer and the computation of the digital value of the voltage at the level of this input, then move on to the measurement of the next input.

The configuration of the computer, according to the various embodiments of the analog input according to the invention, can be obtained by programming, with the aid of a string of instructions recorded in a read-only memory of the computer.

In a variant of the analog input according to the invention, the analog/digital converter exhibits a resolution greater than the stated resolution of the input, a greater resolution of the analog/digital converter than the resolution required for the precision of measurement for the stated measurement range allows the measurement of overshoots of the values of the parameters to be measured.

For example, an eight-bit converter will allow the measurement of 256 voltage levels whereas as a 10-bit converter will allow the measurement of 1024 levels. Specifically, it is sometimes useful to be able to handle overshoots of the physical parameters manifested as an overshoot of the voltage at the output of the sensor with respect to a maximum value stated for the analog input. These overshoots are possible insofar as the measurement voltage range of the analog input is greater than the supply voltage of the product so as to be capable of measuring it. The analog input according to the invention allows the detection of overshoots through the fact that the computer takes into account the supply voltage of the sensor.

The advantage of the analog input according to the invention resides in the fact that it is not necessary to use a voltage reference for the analog/digital converter, the computer taking into account the value of the supply voltage of the sensor, thereby decreasing the cost of automatic control units. The sensor can be supplied with the voltage of the system which may vary without any change in precision of the measurement of the parameter.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. An analog input circuit for an electronic circuit, which input is intended to be connected to an electrical output of a sensor for measuring a physical parameter, the sensor being supplied with a supply voltage Vcc and providing at its electrical output an analog voltage Vs dependent on the parameter to be measured, the analog input comprising:

an analog/digital converter of resolution $R_N$;

a computer controlling said analog/digital converter so as to perform an analog/digital conversion of the supply voltage Vcc, the analog/digital converter providing the computer with a digital value Rsupp of the supply voltage Vcc of the sensor, an analog/digital conversion of the analog voltage Vs of the parameter to be measured, the analog/digital converter providing the computer with a digital value r of the analog voltage Vs to be measured, the computer providing a digital value Vn of the parameter to be measured such that:

$$Vn = (r/Rsupp) R_N.$$

2. The analog input circuit as claimed in claim 1, wherein said analog input circuit comprises at least two analog/digital converters, a first converter for digitizing the supply voltage Vcc and a second converter for digitizing the analog voltage Vs at the output of the sensor.

3. The analog input circuit as claimed in claim 2, wherein the computer is configured to perform the following sequences:

during a first time period T1, the computer instructs the conversion, by the first converter, of the analog supply voltage Vcc of the sensor into a first digital value Rsupp, then the placing of this first digital value in a RAM memory of the computer;

during a second subsequent time period T2, the computer instructs the conversion, by the second converter, of the analog voltage Vs of the sensor into a second digital value r, then the placing of this second digital value in the RAM memory;

during a third subsequent period T3, the computer performs the computation of the digital value Vn corresponding to the actual parameter measured by the sensor while taking account of the supply voltage Vcc such that:

$$Vn = (r/Rsupp) * R_N.$$

4. The analog input circuit as claimed in claim 3, wherein the sequence of the measurements of the voltages Vs1, Vs2, . . . , Vsx, . . . , Vsn and therefore of the sequence of the selections of the inputs of the multiplexer can be subject to priorities preprogrammed into the computer.

5. The analog input circuit as claimed in claim 2, wherein the sequence of the measurements of the voltages Vs1, Vs2, ..., Vsx, ..., Vsn and therefore of the sequence of the selections of the inputs of the multiplexer can be subject to priorities preprogrammed into the computer.

6. The analog input circuit as claimed in claim 2, wherein the sensor is a potentiometer connected by one of its two ends to the supply voltage Vcc and by its other end to a reference potential Vm, the potentiometer providing the device with an analog voltage Vs proportional to the position of its slider.

7. The analog input circuit as claimed in claim 2, wherein the sensor provides a normalized analog voltage of maximum value corresponding to the resolution $R_N$ of the analog-digital converter.

8. The analog input circuit as claimed in claim 1, wherein said analog input circuit comprises a single analog/digital converter and a multiplexer of the signals emanating from various sensors (c1, c2, ..., cn), each of the signals being digitized sequentially by the analog/digital converter, the multiplexer being controlled by the computer.

9. The analog input circuit as claimed in claim 8, wherein the analog/digital converter receives through a voltage adapter the voltages at the output of the signal multiplexer, the multiplexer comprising n+1 inputs (e0, e1, e2, .en) and an output connected through the voltage adapter to the analog input of the analog/digital converter, the first input of the multiplexer being connected to the supply voltage Vcc, each of the other inputs of the multiplexers (e1, e2, ..., en) being connected to a respective sensor C1, C2, ..., Cn respectively providing voltages Vs1, Vs2, ..., Vsn corresponding to various measured physical parameters.

10. The analog input circuit as claimed in claim 9, wherein the computer is configured to perform the following sequences:

during a first time period T10: instruction by the computer for selection of the input c0 of the multiplexer and conversion, by the analog/digital converter of the analog supply voltage Vcc of the sensor present at this input c0 of the multiplexer into a first digital value Rsupp, then placement of this first digital value in a RAM memory of the computer;

during subsequent time periods T11, T12, ..., T1n, instruction by the computer for sequential selection of the inputs e1, e2, ..., ex, ..., en of the multiplexer and conversion, by the analog/digital converter, of the respective analog voltage Vs1, Vs2, ..., Vsx, ..., Vsn at the output of the respective sensor C1, C2, ..., Cx, ..., Cn into a respective digital value r1, r2, ..., rx, ..., rn and placement of each of these values in memory, then computation of the respective digital value Vn1, Vn2, ..., Vnx, ..., Vnn of the value corresponding to the voltages Vs1, Vs2, ..., Vsx, ..., Vsn at the output of the respective sensors C1, C2, ..., Cx, ..., Cn, in such a way that:

$Vnx=(rx/Rsupp)*R_N$ with $x=1, 2, \ldots n$.

11. The analog input circuit as claimed in claim 10, wherein the sequence of the measurements of the voltages Vs1, Vs2, ..., Vsx, ..., Vsn and therefore of the sequence of the selections of the inputs of the multiplexer can be subject to priorities preprogrammed into the computer.

12. The analog input circuit as claimed in claim 9, wherein the sequence of the measurements of the voltages Vs1, Vs2, ..., Vsx, ..., Vsn and therefore of the sequence of the selections of the inputs of the multiplexer can be subject to priorities preprogrammed into the computer.

13. The analog input circuit as claimed in claim 8, wherein the sequence of the measurements of the voltages Vs1, Vs2, ..., Vsx, ..., Vsn and therefore of the sequence of the selections of the inputs of the multiplexer can be subject to priorities preprogrammed into the computer.

14. The analog input circuit as claimed in claim 1, wherein the sensor is a potentiometer connected by one of its two ends to the supply voltage Vcc and by its other end to a reference potential Vm, the potentiometer providing the device with an analog voltage Vs proportional to the position of its slider.

15. The analog input circuit as claimed in claim 14, wherein the analog/digital converter receives through a voltage adapter the voltages at the output of the signal multiplexer, the multiplexer comprising n+1 inputs (e0, e1, e2, .en) and an output connected through the voltage adapter to the analog input circuit of the analog/digital converter, the first input of the multiplexer being connected to the supply voltage Vcc, each of the other inputs of the multiplexers (e1, e2, ..., en) being connected to a respective sensor C1, C2, ..., Cn respectively providing voltages Vs1, Vs2, ..., Vsn corresponding to various measured physical parameters.

16. The analog input circuit as claimed in claim 14, wherein the computer is configured to perform the following sequences:

during a first time period T10: instruction by the computer for selection of the input c0 of the multiplexer and conversion, by the analog/digital converter of the analog supply voltage Vcc of the sensor present at this input c0 of the multiplexer into a first digital value Rsupp, then placement of this first digital value in a RAM memory of the computer;

during subsequent time periods T11, T12, ..., T1n, instruction by the computer for sequential selection of the inputs e1, e2, ..., ex, ..., en of the multiplexer and conversion, by the analog/digital converter, of the respective analog voltage Vs1, Vs2, ..., Vsx, ..., Vsn at the output of the respective sensor C1, C2, ..., Cx, ..., Cn into a respective digital value r1, r2, ..., rx, ..., rn and placement of each of these values in memory, then computation of the respective digital value Vn1, Vn2, ..., Vnx, ..., Vnn of the value corresponding to the voltages Vs1, Vs2, ..., Vsx, ..., Vsn at the output of the respective sensors C1, C2, ..., Cx, ..., Cn, in such a way that:

$Vnx=(rx/Rsupp)*R_N$ with $x1, 2, \ldots n$.

17. The analog input circuit as claimed in claim 1, wherein the sensor provides a normalized analog voltage of maximum value corresponding to the resolution $R_N$ of the analog-digital converter.

18. The analog input circuit as claimed in claim 17, wherein the analog/digital converter receives through a voltage adapter the voltages at the output of the signal multiplexer, the multiplexer comprising n+1 inputs (e0, e1, e2, .en) and an output connected through the voltage adapter to the analog input of the analog/digital converter, the first input of the multiplexer being connected to the supply voltage Vcc, each of the other inputs of the multiplexers (e1, e2, ..., en) being connected to a respective sensor C1, C2, ..., Cn respectively providing voltages Vs1, Vs2, ..., Vsn corresponding to various measured physical parameters.

19. The analog input circuit as claimed in claim 17, wherein the computer is configured to perform the following sequences:

during a first time period T10: instruction by the computer for selection of the input c0 of the multiplexer and conversion, by the analog/digital converter of the analog supply voltage Vcc of the sensor present at this input c0 of the multiplexer into a first digital value Rsupp, then placement of this first digital value in a RAM memory of the computer;

during subsequent time periods T11, T12, . . . , T1n, instruction by the computer for sequential selection of the inputs e1, e2, . . . , ex, . . . , en of the multiplexer and conversion, by the analog/digital converter, of the respective analog voltage Vs1, Vs2, . . . , Vsx, . . . , Vsn at the output of the respective sensor C1, C2, . . . , Cx, . . . , Cn into a respective digital value r1, r2, . . . , rx, . . . , rn and placement of each of these values in memory, then computation of the respective digital value Vn1, Vn2, . . . , Vnx, . . . , Vnn of the value corresponding to the voltages Vs1, Vs2, . . . , Vsx, . . . , Vsn at the output of the respective sensors C1, C2, . . . , Cx, . . . , Cn, in such a way that:

$$Vnx = (rx/Rsupp) * R_N \text{ with } x=1, 2, \ldots n.$$

20. The analog input circuit as claimed in claim 1, wherein the analog/digital converter exhibits a resolution greater than the stated resolution of the analog input circuit, a greater resolution of the analog/digital converter than the resolution required for the precision of measurement for the stated measurement range allowing the measurement of overshoots of the values of the parameters to be measured.

* * * * *